United States Patent
Peethala et al.

(10) Patent No.: US 10,366,879 B2
(45) Date of Patent: Jul. 30, 2019

(54) DRY AND WET ETCH RESISTANCE FOR ATOMIC LAYER DEPOSITED TIO2 FOR SIT SPACER APPLICATION

(71) Applicant: International Business Machines Corporation, Armonk, NY (US)

(72) Inventors: Cornelius Brown Peethala, Slingerlands, NY (US); Ekmini A. De Silva, Slingerlands, NY (US); Abraham Arceo de la Pena, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/811,872

(22) Filed: Nov. 14, 2017

(65) Prior Publication Data

US 2019/0148140 A1     May 16, 2019

(51) Int. Cl.
    H01L 21/02     (2006.01)
(52) U.S. Cl.
    CPC .... *H01L 21/02186* (2013.01); *H01L 21/0228* (2013.01); *H01L 21/0234* (2013.01); *H01L 21/02274* (2013.01)
(58) Field of Classification Search
    None
    See application file for complete search history.

(56) References Cited

U.S. PATENT DOCUMENTS

| | | | |
|---|---|---|---|
| 8,901,016 B2 | 12/2014 | Ha et al. | |
| 9,129,906 B2 | 9/2015 | Wu et al. | |
| 9,478,411 B2 | 10/2016 | Thombare et al. | |
| 9,779,942 B1* | 10/2017 | Kuo | H01L 21/31144 |
| 2004/0048194 A1 | 3/2004 | Breyta et al. | |
| 2008/0075881 A1 | 3/2008 | Won et al. | |
| 2015/0099072 A1 | 4/2015 | Takamure et al. | |
| 2015/0247258 A1 | 9/2015 | Diankov et al. | |
| 2016/0056037 A1 | 2/2016 | Thombare et al. | |

OTHER PUBLICATIONS

Das et al., "Thermal and plasma enhanced atomic layer deposition of TiO2: Comparison of spectroscopic and electric properties", 01A144-1 J. Vac. Sci. Technol. A 33(1), Jan./Feb. 2015, © C 2014 American Vacuum Society, <http://dx.doi.org/10.1116/1.4903938>, 8 pages.

Pongwan et al., "Highly Efficient Visible-Light-Induced Photocatalytic Activity of Fe-doped TiO2 Nanoparticles", Engineering Journal vol. 16 Issue 3, Published Jul. 1, 2012, Online at <http://www.engj.org/, DOI:10.4186/ej.2012.16.3.143>, 10 pages.

Shestaeva et al., "Mechanical, structural, and optical properties of PEALD metallic oxides for optical applications", Applied Optics, vol. 56, No. 4 / Feb. 1, 2017 / Applied Optics, Journal © 2017 Optical Society of America, 13 pages.

* cited by examiner

*Primary Examiner* — Asok K Sarkar
(74) *Attorney, Agent, or Firm* — Gilbert Harmon, Jr.

(57) ABSTRACT

Embodiments describing an approach for creating an etch resistant Titanium Oxide film for sidewall image transfer (SIT) spacer application. Generating a mandrel formation, and depositing a Titanium Oxide spacer on the mandrel formation, wherein depositing the Titanium Oxide spacer further comprises at least one of exposing the Titanium Oxide spacer to at least 100 C or plasma conditions of RF power are at least 500 W for at least 1 second.

19 Claims, 2 Drawing Sheets

DRY AND WET ETCH RESISTANCE FOR ATOMIC LAYER DEPOSITED TIO2 FOR SIT SPACER APPLICATION

BACKGROUND OF THE INVENTION

The present invention relates generally to the field of semiconductors, and more particularly to Titanium Oxide film.

Atomic layer deposition (ALD) is a vapor phase thin film deposition technique that has gained considerable popularity in recent years. The following list of ALD benefits goes a long way towards explaining the broad popularity of the technique (i) wide range of materials available including oxides, nitrides, sulfides, fluorides, metals, ternaries, quaternaries, chalcogenides, etc., (ii) digital film thickness control with Angstrom level resolution, (iii) excellent film uniformity even over large substrate sizes, (iv) relatively low deposition temperatures with some processes available at room temperature allowing deposition on temperature sensitive substrates such as plastics (especially when deposition is plasma enhanced), (v) moderate vacuum levels with some processes available at atmospheric pressure, (vi) conformal coatings on high aspect ratio topographies, (vii) excellent film adhesion to underlying substrates, (viii) ability to mix different film chemistries to gain the advantages of doping and laminates, and (ix) relatively simple hardware compared to other thin film deposition techniques.

Atomic Layer Deposition (ALD) and/or Plasma Enhanced Atomic Layer Deposition (PEALD) titanium oxide (TiOx) can be used as a spacer material, especially for back end of line (BEOL) sidewall image transfer (SIT) patterning. Titanium Oxide has potential benefit over $SiO_2$ spacer due to less spacer erosion and high selectivity during subsequent etch. But Titanium Oxide spacer film gets modified during spacer etch back/mandrel removal using F and Cl based chemistry, and once modified the spacer materials have high wet etch rate in common wet clean solutions (HF, HCl, polyacrylamide (PAM), and/or standard cleans (SC) 9SC-1 and/or SC-2). However, this leads to an increase in spacer loss and critical dimension (CD) blow out during the wet clean processing. Additionally, scanning transmission electron microscope (STEM) comparison after wet etching show blanket data for higher thickness loss was confirmed, demonstrating a need to improve this CD bias post wets.

SUMMARY

Embodiments of the present invention disclose a method, and a system for creating an etch resistant Titanium Oxide film for sidewall image transfer (SIT) spacer application. A method for creating an etch resistant Titanium Oxide film for sidewall image transfer (SIT) spacer application, the method can include generating a mandrel formation, and depositing a Titanium Oxide spacer on the mandrel formation, in which depositing the Titanium Oxide spacer further comprises at least one of exposing the Titanium Oxide spacer to at least 100 C or plasma conditions of RF power are at least 500 W for at least 1 second.

A system for creating an etch resistant Titanium Oxide film for sidewall image transfer (SIT) spacer application, the system can include instructions to generate a mandrel formation, and deposit a Titanium Oxide spacer on the mandrel formation, in which depositing the Titanium Oxide spacer further comprises at least one of exposing the Titanium Oxide spacer to at least 100 C or plasma conditions of RF power are at least 500 W for at least 1 second.

A method for creating an etch resistant Titanium Oxide film for sidewall image transfer (SIT) spacer application, the method can include generating a mandrel formation. Annealing the Titanium Oxide spacer, and applying post anneal processing comprising low RF conditions ranging from 0.5 to 500 W.

DETAILED DESCRIPTION

Figure 1:
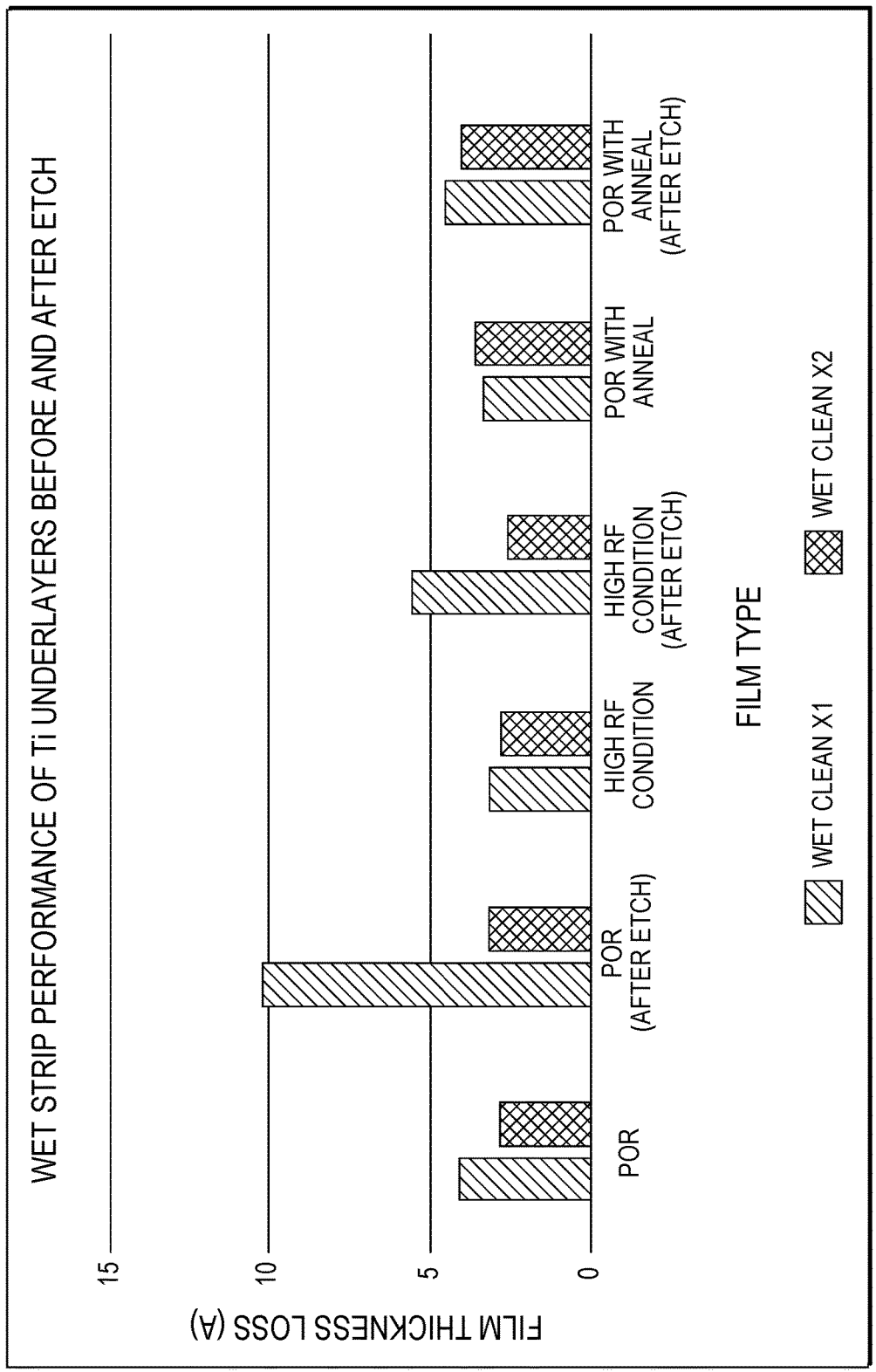
FIG. 1 is a depiction of the decreased film loss of the etch resistant Titanium Oxide films.

Embodiments of the present invention develop a Titanium Oxide film that is etch resistant to modification via etch gas and undergoes lower spacer thickness loss when exposed to spacer wet cleans, improved the art of Titanium Oxide film. In various embodiments, the benefits of Titanium Oxide spacer include, but are not limited to, 260 Angstroms Titanium Oxide spacer, 60 nm organic planarization layer (OPL) mandrel with 150 Angstroms, In-situ deposition oxide cap, and/or 15 nm Tetraethyl orthosilicate (TEOS) inserted to get selectivity 30 nm Titanium Nitride (TiN) stack. In various embodiments, Titanium Oxide spacer feasibility can exhibit 20-60 nm OPL mandrel, resulting in shorter mandrel height than with oxide spacer.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In various embodiments, Titanium Oxide can be deposited conformally through thermal atomic layer deposition (ALD) or Plasma assisted ALD (e.g., Plasma Enhanced Atomic Layer Deposition (PEALD)). ALD is a thin film deposition technique that is based on the sequential use of a gas phase chemical process. ALD is considered a subclass of chemical vapor deposition. The majority of ALD reactions use two chemicals, typically called precursors. These precursors react with the surface of a material one at a time in a sequential, self-limiting, manner. Through the repeated exposure to separate precursors, a thin film is slowly deposited. ALD is a process in the fabrication of semiconductor devices, and part of the set of tools available for the synthesis of nanomaterials. Additionally, ALD has the capability of controlling the deposition thickness of thin films to the order of one atomic monolayer. Chemical gases (precursors) are carefully selected for ALD so that after a single layer of the gas sticks to the surface, the surface is passivated. Before the next layer is deposited the passivating atoms must be removed in various ways (e.g., chemical reactions, thermal spikes, etc.). A step in Plasma Enhanced Atomic Layer Deposition (PEALD) is to remove passivating hydrogen atoms without the use of a thermal spike. For example, breaking the remaining Si—H bonds using energy from Ar plasma, while decreasing the substrate temperature to within the thermal budget of front-end chip processing. Plasma is a mixture of ions, electrons, excited atoms and neutral atoms. Argon ions and excited atoms (metastable atoms) have 15.75 eV and >10.55 eV potential energies, respectively. Therefore, referencing the previous example, these argon plasma species have sufficient energies to break Si—H bonds (3-4 V), even if the substrate temperature is below 550 C. In various embodiments, once the plasma has chemically activated the surface, the next monolayer of precursor can be introduced, completing the ALD cycle.

In various embodiments, Atomic Layer Deposition (ALD) is typically carried out in a heated reactor that is being maintained at a sub-atmospheric pressure through the application of a vacuum pump and a controlled flow of inert gas, such as nitrogen, N2. Substrates to be coated with an ALD film are placed in the reactor and allowed to equilibrate with the reactor temperature before the ALD process is started. An ALD cycle consists of a series of steps. The following steps of the ALD cycle are described using the deposition of Al2O3 with TriMethylAluminum (Al(CH3)3, TMA) and water (H2O), as an example. Step 1, at the beginning of the cycle, before the substrate is exposed to the first precursor, the substrate surface is covered with hydroxyl (—OH) groups. Step 2, Precursor a pulse. Typically, a metal containing volatile precursor is introduced to the reactor. Precursor A reacts with active sites on the substrate surface. Precursor A does not react with itself in the gas phase or with the A chemisorbed to the substrate surface. This self-limiting process is key to several of the desirable ALD film properties such as conformal coating of high aspect ratio features, pinhole free films, and digital growth control. For the TMA+H2O→Al2O3 process, methyl groups on the TMA react with surface hydroxyl groups leading to strong, oxygen-aluminum bonds with methane given off as a reaction product. Sufficient TMA is introduced to the reactor to react with all available hydroxyl groups. Some hydroxyl groups will go unreacted due to steric interference from TMA chemisorbed at adjacent sites.

Al(CH3)3(gas)+m—OH(surface)→-Om—Al(CH3)3-m))(surface)+mCH4(gas).

Step 3, the carrier gas is given time to remove excess precursor A and reaction products from the reactor. If the ALD co-reactant is introduced to the reactor before all of precursor A is removed, gas phase CVD reactions will take place. For the Al2O3 example, the first purge step removes any excess TMA and CH4 reaction product from the reactor prior to the introduction of the co-reactant. If the co-reactant (H2O) and TMA are both in the gas phase, they will react to form Al2O3 via CVD-type reactions which will deposit onto the substrate in a non-self-limiting fashion negatively impacting the desirable traits of the ALD films. Step 4 after all of the precursor A and reaction products have been purged, the substrate is prepared to be exposed to the co-reactant. Not every active site will be utilized due to the steric hindrance of precursor ligands on adjacent sites. In this particular example, the methyl groups on the chemisorbed TMA can physically block another TMA from reacting with an adjacent —OH group. ALD films tend to grow at rates substantially below the true monolayer thickness for a given material. Processes utilizing bulkier precursors will have slower growth per cycle rates compared to processes using physically smaller precursors because the bulkier precursor ligands block more active sites. Step 5, thermal ALD. A co-reactant is introduced to the reactor which reacts with chemisorbed precursor A, again in a self-limiting manner, to provide the desired film. Precursor B will also leave the surface prepared to react with another pulse of precursor A. For the TMA+H2O→Al2O3 process/ example, H2O reacts with methyl groups on the chemisorbed TMA releasing methane and leaving the surface covered in hydroxyl groups, just as was seen prior to the initial TMA pulse. Sufficient H2O is introduced to the reactor to react with all available methyl groups.

—Al(CH3)n(surface)+nH2O(gas)→—Al(OH)n(surface)+nCH4(gas)

A variety of molecules have been investigated as ALD co-reactants. Commonly used co-reactants include: O3, H2O2, O2, NH3, and H2S. Step 6, Co-reactant Purge, purge to remove excess precursor B and reaction products from the reactor. Gas phase reactions will lead to CVD-like behavior, so there should be no precursor B in the gas phase when precursor B is introduced to the reactor. For the Al2O3 example, the second purge step removes any excess H2O and CH4 reaction product from the reactor prior to the introduction of the TMA. If the co-reactant (H2O) and TMA are both in the gas phase, they will react to form Al2O3 via CVD-type reactions which will deposit onto the substrate in a non-self-limiting fashion negatively impacting the desirable traits of the ALD films. Compare this picture to the one from the beginning. Like the surface prior to the precursor A exposure, the surface is covered in hydroxyl groups, but now there is a new sub-monolayer of Al2O3 where the previous layer of hydroxyl groups was. Step 7: After the Co-reactant Purge. After step 6, the substrate surface looks just very similar to prior to step 1. In the Al2O3 example, after the water purge step is completed, the surface again is covered in hydroxyl groups, just as it had at the beginning, ready for the next pulse of TMA. The hydroxyl groups can look tightly packed together and blocking each other, but that is due to the limitation of the simplified two-dimensional representation of the process. Furthermore, deposition conditions including temperature, gas flows, TMA and H2O dosing, precursor purity, pressure, substrate material and topography, and post-deposition anneal can impact important film properties such as deposition rate, dielectric constant, leakage current, breakdown voltage, barrier properties, film density, uniformity, etc. And this is for one of the best behaved and understood ALD processes. Furthermore, ALD utilizing a mid-based titanium sources, tetrakis-dimethylamido-titanium [(NMe2)4-Ti, TDMAT] is a common ALD method for forming TiO2.

In various embodiments, plasmas are low pressure gases that have been partially ionized through application of an external power source. High energy electrons in these plasmas can be used to disassociate molecular feed gases into highly reactive radical fluxes (e.g., O2+e-→2O*). O* symbolizes Oxygen radical fluxes. Plasmas enable adding lots of reactivity without adding lots of heat. Radicals are many times more reactive than molecular co-reactants and can improve the ALD process in several ways. For PEALD (e.g., O2 Plasma) a O2 plasma step, a flux of O* radicals will be incident upon the substrate surface, reacting with the methyl groups in a combustion-like process replaces the thermal ALD H2O pulse step, replacing the thermal ALD H2O pulse step (e.g., Step 4, described above).

O*+—CH3→CO,CO2,H2O

The surface chemistry for the plasma process is not nearly as clean as that for the thermal ALD process. It is not obvious what should be the state of the substrate surface following the O2 plasma step as compared to following the H2O pulse step in the thermal ALD process. Surface analysis indicates that the surface of the depositing Al2O3 is again covered in hydroxyl groups, perhaps aided by the H2O produced by the combustion of the methyl groups.

In various embodiments, hardware to perform plasma ALD can be considerably more complex and expensive than thermal ALD. At a minimum, a plasma source is required with an RF power supply and additional gas flow controllers are needed. Higher pumping costs can be necessary as well. Due to the short lifetime of radicals, reactor design becomes more complicated to ensure uniform exposure of the substrate to the radical flux. Some of the benefits of going through the cost and effort to shift from thermal ALD to plasma ALD include: lower temperature processing; improved film properties due to more complete reaction with depositing film and precursor ligand removal; more film options as precursors un-reactive to molecular co-reactants become available; reduced purge times, particularly at low temperatures where thermal co-reactants (i.e. H2O) require long purge times, and/or reduced nucleation times. Whether the process is called "Plasma" or "Radical" depends on if the substrate is in contact with the plasma or not. "Plasma" processes are sufficiently coupled to the plasma source that some amount of substrate ion bombardment is likely. "Radical" processes have the substrate sufficiently removed from the plasma source that substrate ion bombardment is very low and only the longer-lived radical flux is incident upon the substrate surface. Although there are different names, and they refer to subtly different processing conditions, it appears as if the research community has primarily settled on collectively referring to all these types of processing as PEALD.

In various embodiments, this process improved film resistance to wet and dry etching for Titanium Oxide spacer is formed by increasing density, hardness and Titanium composition in the film. In various embodiments, Titanium Oxide can be any compound of Titanium oxide known in the art. For example, TiO2, TiO3, TiO4, TiO5, etc. In various embodiments, this is achieved by depositing a Titanium Oxide film under high radio frequency (RF) plasma conditions of approximately 500 to 800 watts (W). In some embodiments, high RF plasma conditions can range from 500 to 1000 W. In other embodiments, an improvement on process of record (POR) Titanium Oxide film is through oxide plasma anneal post deposition (e.g., post anneal processing) at low RF conditions ranging from 0.5 to 500 W.

In various embodiments, wet etch rates of the etch resistant Titanium Oxide films were compared for film loss post strip with and without etch. The results can be seen in FIG. 1. FIG. 1 illustrates the comparison and improved resistance of High RF Titanium Oxide, and Titanium Oxide deposited at POR conditions and annealed with oxygen plasma. As seen in FIG. 1, wet etching erosion was reduced on the first wet pass.

In various embodiments, the etch resistant Titanium Oxide film can be designed with high density and hardness comprising a Titanium Oxide density of at least 5 g/cm$^3$, a Hardness of at least 10 gigapascals (GPa), and a Titanium percentage of at least 30%. In various embodiments, the aforementioned composition and/or film characterization (e.g., Titanium Oxide density of at least 5 g/cm$^3$, a Hardness of at least 10 GPa, and a Titanium percentage of at least 30%) can increase Ti—O bonding, as shown in Table 1. In various embodiments, the Titanium Oxide spacer can be deposited with films formed with above characteristics to prevent CD blow out with DHF based wets.

TABLE 1

Describes the characteristics of the etch resistant Titanium Oxide film

| | Ti—Ti (Atomic %) | Ti—O (Atomic %) | Ti—C % (Atomic %) | Ti (Atomic %) | Film Density | Film hardness |
|---|---|---|---|---|---|---|
| POR TiOx | 0.0989 | 62.58 | 1.56 | 25.48 | 3.9 | 6.8 |
| High RF TiOx | 0.005 | 65.89 | 0.08 | 34.56 | 5.2 | 10.5 |
| POR Tiox after Oxygen Plasma Anneal | 0.248 | 67.89 | 0.12 | 32.56 | 4.8 | 9.6 |

In various embodiments, for improved film properties the deposition temperature can be at least 100 Celsius (C) and the plasma conditions comprise RF Power of at least 50 W for at least 1 second. In some embodiments, the RF time can be about 1 second to about 60 seconds. In one embodiment, post plasma processing comprises at least one of oxygen plasma anneal with oxygen (O2) flow, or high thermal anneal (no more than 300 C) to target the Titanium Oxide film characteristics. In various embodiments, oxygen plasma anneal can be an oxide plasma anneal. In some embodiments, process parameters (RF power 500-1000 W) can be adjusted on a PEALD platform to tune material chemistry to enable Titanium Oxide spacer material with high density of no more than 4 g/cm$^3$ and a hardness of at least 10 GPa. In other embodiments, oxygen plasma anneal can be used to increase film hardness and density to decrease spacer loss after DHF or SC-1 based wets, in which SC-1 is performed with a solution of 5 parts of deionized water, 1 part of aqueous NH4OH (ammonium hydroxide, 29% by weight of NH3), 1 part of aqueous H2O2 (hydrogen peroxide, 30%), at 75 or 80° C. typically for 10 minutes, as an example, ratios may vary. This base-peroxide mixture removes organic residues. Additionally, SC-2 is performed with a solution of 6 parts of deionized water, 1 part of aqueous HCl (hydrochloric acid, 37% by weight), and 1 part of aqueous H2O2 (hydrogen peroxide, 30%), ratios may vary. In various embodiments, the etch resistant Titanium Oxide can have a thickness of about 10 Angstroms to about 500 Angstroms when treated with ALD. In some embodiments, when the Titanium Oxide undergoes PEALD the plasma is direct. In some embodiments, when the Titanium Oxide undergoes thermal ALD the plasma can be remote.

The present invention will now be described in detail with respect to the figures.

Figure 2:
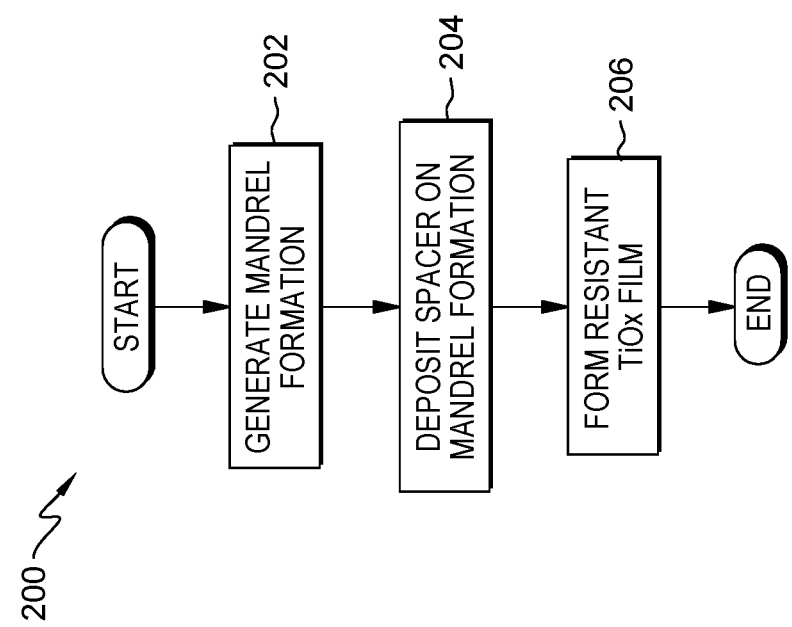
FIG. 2 is a flowchart depicting the operational steps of a method of forming etch resistant Titanium Oxide film, in accordance with an embodiment of the invention.

FIG. 2 is a flowchart depicting the operational steps of a method of forming/generating a dry and wet etch resistant Titanium Oxide film (e.g., etch resistant Titanium Oxide film/PEALD TiO2) for SIT spacer applications, in accordance with the depicted embodiment of the invention. Inducing strain onto the channel of a transistor allows for the conductivity of the channel to be changed in a predictable manner.

In step 202, the Titanium Oxide film is created by generating a mandrel formation. In various embodiments, mandrel formations can be generated on a substrate.

In step 204, spacer is deposited on the mandrel formation. In various embodiments, Titanium Oxide spacer can be deposited on a mandrel formation using high RF and high temperature, wherein the high RF conditions are at least 500 W and the temperature is at least 100 C. In various embodiments, Titanium Oxide can be deposited conformally through thermal ALD or Plasma assisted ALD, wherein the temperature is higher than 100 C and plasma conditions RF Power are at least 500 W for at least 1 second. In step 206, the etch resistant Titanium Oxide film is formed/generated.

Figure 3:
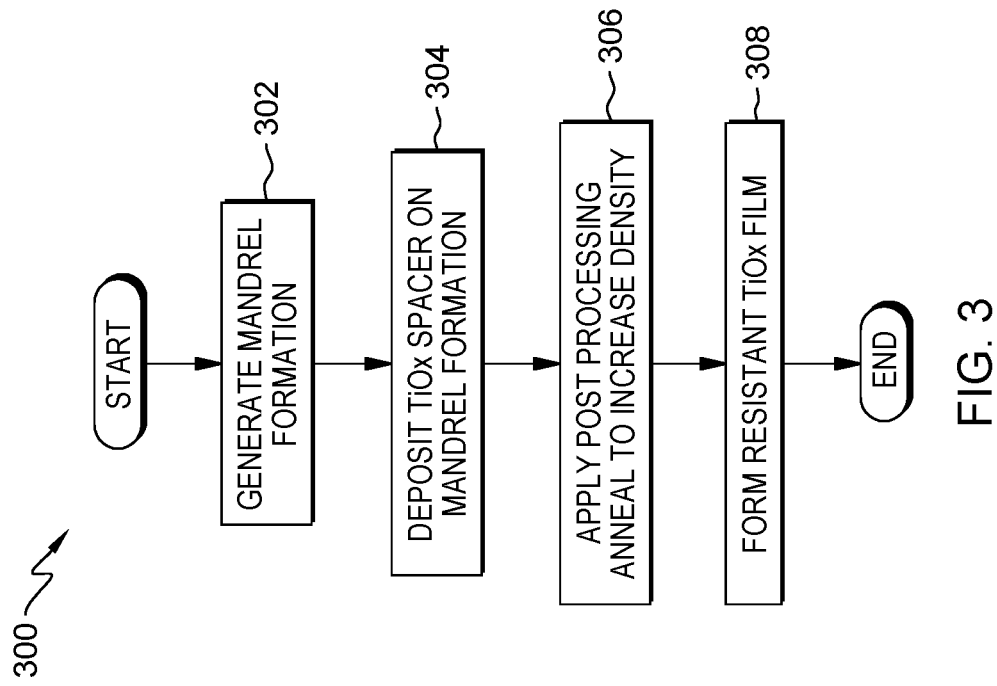
FIG. 3 is a flowchart depicting the operational steps of a method of forming etch resistant Titanium Oxide film, in accordance with an embodiment of the invention.

FIG. 3 is a flowchart depicting the operational steps of a method of forming/generating a dry and wet etch resistant Titanium Oxide film (e.g., etch resistant Titanium Oxide film/PEALD TiO2) for SIT spacer applications, in accordance with the depicted embodiment of the invention. Inducing strain onto the channel of a transistor allows for the conductivity of the channel to be changed in a predictable manner.

In step 302, mandrel formation is generated. In various embodiments, mandrel formations can be generated on a substrate.

In step 304, spacer is deposited on the mandrel formation. In various embodiments, Titanium Oxide is deposited conformally through thermal ALD or Plasma assisted ALD, wherein the temperature is higher than 100 C and plasma conditions RF Power are at least 50 W for at least 1 second.

In step 306, post processing anneal is applied to increase density and Titanium Oxide composition. In various embodiments, applying a post processing anneal to the deposited Titanium Oxide spacer can increase the Titanium Oxide film and/or spacer density and/or increase Ti—O bonding. In various embodiments, applying the post processing anneal comprises oxygen plasma anneal with O2 flow and/or high thermal anneal of no more than 300 C. In step 308, the etch resistant Titanium Oxide film is formed/generated.

The method as described above is used in the creating of PEALD Titanium Oxide film for SIT spacer application and/or fabrication of integrated circuit chips.

The resulting semiconductor device may be included on a semiconductor substrate consisting of many devices and one or more wiring levels to form an integrated circuit chip. The resulting integrated circuit chip(s) can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. A method for creating an etch resistant Titanium Oxide film for sidewall image transfer (SIT) spacer application, the method comprising:
generating a mandrel formation;
depositing a Titanium Oxide spacer on the mandrel formation, wherein depositing the Titanium Oxide spacer further comprises at least one of exposing the Titanium Oxide spacer to at least 100 C and plasma conditions of RF power of least 500 W for at least 1 second; and
generating a Titanium Oxide film, wherein the Titanium Oxide film comprises: Titanium Oxide density of at least 5 g/cm3, a hardness of at least 10 GPa, and a Titanium percentage of at least 30%.

2. The method of claim 1 further comprising:
annealing a Titanium Oxide spacer.

3. The method of claim 1, wherein depositing the Titanium Oxide spacer comprises depositing the Titanium Oxide conformally using at least one of ALD or PEALD.

4. The method of claim 3, wherein the PEALD comprises plasma conditions, and wherein the plasma conditions comprise an RF power between 500 W and 1000 W.

5. The method of claim 1, wherein the Titanium Oxide film characteristics further comprises an increased Ti—O bonding.

6. The method of claim 1, further comprising:
applying a post processing anneal, wherein the post processing anneal comprises exposing the Titanium Oxide spacer to an oxide plasma anneal post deposition at low RF conditions of at least 500 W.

7. The method of claim 6, wherein the oxygen plasma anneal comprises at least one of Oxygen flow or high thermal anneal of no more than 300 C.

8. A system for creating an etch resistant Titanium Oxide film for sidewall image transfer (SIT) spacer application, the system comprising instructions to:
generate a mandrel formation; and
deposit a Titanium Oxide spacer on the mandrel formation, wherein depositing the Titanium Oxide spacer further comprises at least one of exposing the Titanium Oxide spacer to at least 100 C or plasma conditions of RF power are at least 500 W for at least 1 second and
generate a Titanium Oxide film, wherein the Titanium Oxide film comprises: Titanium Oxide density of at least 5 g/cm3, a hardness of at least 10 GPa, and a Titanium percentage of at least 30%.

9. The system of claim 8, further comprising:
anneal a Titanium Oxide spacer.

10. The system of claim 8, wherein depositing the Titanium Oxide spacer comprises depositing the Titanium Oxide conformally using at least one of ALD or PEALD.

11. The system of claim 10, wherein the PEALD comprises plasma conditions, and wherein the plasma conditions comprise an RF power between 500 W and 1000 W.

12. The system of claim 8, wherein the Titanium Oxide film characteristics further comprises an increased Ti—O bonding.

13. The system of claim 8, further comprising:
applying a post processing anneal, wherein the post processing anneal comprises exposing the Titanium Oxide spacer to an oxide plasma anneal post deposition at low RF conditions of at least 500 W.

14. The system of claim 13, wherein the oxygen plasma anneal comprises at least one of Oxygen flow or high thermal anneal of no more than 300 C.

15. A method for creating an etch resistant Titanium Oxide film for sidewall image transfer (SIT) spacer application, the method comprising:

generating a mandrel formation;

annealing the Titanium Oxide spacer;

applying post anneal processing comprising low RF conditions ranging from 0.5 to less than 500 W; and generating a Titanium Oxide film, wherein the Titanium Oxide film comprises film characteristics of at least one of Titanium Oxide density of at least 5 g/cm3, a hardness of at least 10 GPa, a Titanium percentage of at least 30%, or increased Ti—O bonding.

16. The method of claim 15, where in annealing the Titanium Oxide Spacer further comprises:

depositing the titanium oxide spacer, wherein depositing the Titanium Oxide spacer further comprises exposing the Titanium Oxide spacer to at least 100 C and plasma conditions of RF power are at least 500 W for at least 1 second.

17. The method of claim 16, wherein depositing the Titanium Oxide spacer comprises depositing Titanium Oxide conformally using at least one of ALD or Plasma assisted ALD.

18. The method of claim 17, wherein the PEALD comprises plasma conditions, and wherein the plasma conditions comprise an RF power between 500 W and 1000 W.

19. The method of claim 15, wherein the post anneal processing further comprises: oxygen plasma anneal comprising at least one of Oxygen flow or high thermal anneal of no more than 300 C.

\* \* \* \* \*